(12) United States Patent
Cok et al.

(10) Patent No.: US 10,431,719 B2
(45) Date of Patent: Oct. 1, 2019

(54) DISPLAY WITH COLOR CONVERSION

(71) Applicant: X-Celeprint Limited, Cork (IE)

(72) Inventors: Ronald S. Cok, Rochester, NY (US); Christopher Bower, Raleigh, NC (US); Matthew Meitl, Durham, NC (US)

(73) Assignee: X-Celeprint Limited, Cork (IE)

(*) Notice: Subject to any disclaimer, the term of this patent is extended or adjusted under 35 U.S.C. 154(b) by 757 days.

(21) Appl. No.: 14/930,363

(22) Filed: Nov. 2, 2015

(65) Prior Publication Data

US 2017/0122502 A1    May 4, 2017

(51) Int. Cl.
*H01L 21/00* (2006.01)
*H01L 33/38* (2010.01)
(Continued)

(52) U.S. Cl.
CPC .............. *H01L 33/385* (2013.01); *F21K 9/60* (2016.08); *F21V 9/08* (2013.01); *G02B 26/04* (2013.01);
(Continued)

(58) Field of Classification Search
CPC .............. H01L 33/385; H01L 23/4821; H01L 23/5381; H01L 25/0753; H01L 25/167; H01L 27/156; H01L 33/36; H01L 33/38; H01L 33/48; H01L 33/50; H01L 33/502; H01L 33/508; H01L 25/27; H01L 25/156; H01L 33/20; H01L 33/405; H01L 33/58; H05K 1/0306; H05K 1/09; H05K 1/181; H05K 1/182
See application file for complete search history.

(56) References Cited

U.S. PATENT DOCUMENTS 4,746,202 A    5/1988    Perilloux et al.
5,060,027 A    10/1991   Hart et al.
(Continued)

FOREIGN PATENT DOCUMENTS

CN    103677427 A    3/2014
EP    1662301 A1    5/2006
(Continued)

OTHER PUBLICATIONS

Matioli, E. et al., High-brightness polarized light-emitting diodes, Light: Science & Applications, 1:e22:1-7 (2012).
(Continued)

*Primary Examiner* — Richard A Booth
(74) *Attorney, Agent, or Firm* — William R. Haulbrook; Michael D. Schmitt; Choate, Hall & Stewart LLP

(57) ABSTRACT

A color-conversion structure includes an article comprising a color-conversion material disposed within a color-conversion layer. At least a portion of a tether is within or extends from the article. The color-conversion structure can be disposed over a sacrificial portion of a substrate to form a micro-transfer printable device and micro-transfer printed to a display substrate. The color-conversion structure can include an light-emitting diode or laser diode that is over or under the article. Alternatively, the article is located on a side of a display substrate opposite an inorganic light-emitting diode. A display includes an array of color-conversion structures disposed on a display substrate.

21 Claims, 13 Drawing Sheets

(51) Int. Cl.

| | | |
|---|---|---|
| *G09G 3/32* | (2016.01) | |
| *H01L 23/482* | (2006.01) | |
| *H01L 23/538* | (2006.01) | |
| *H01L 25/075* | (2006.01) | |
| *H01L 33/62* | (2010.01) | |
| *H01L 33/50* | (2010.01) | |
| *H01L 33/60* | (2010.01) | |
| *H05B 33/08* | (2006.01) | |
| *G02B 26/04* | (2006.01) | |
| *G02F 1/167* | (2019.01) | |
| *H01L 25/16* | (2006.01) | |
| *H01L 33/36* | (2010.01) | |
| *H01L 33/48* | (2010.01) | |
| *H05K 1/03* | (2006.01) | |
| *H05K 1/09* | (2006.01) | |
| *H05K 1/18* | (2006.01) | |
| *H05K 5/00* | (2006.01) | |
| *G09G 3/22* | (2006.01) | |
| *H01L 27/15* | (2006.01) | |
| *F21V 9/08* | (2018.01) | |
| *H01L 33/58* | (2010.01) | |
| *F21K 9/60* | (2016.01) | |
| *H01L 33/20* | (2010.01) | |
| *H01L 33/40* | (2010.01) | |
| *F21Y 105/10* | (2016.01) | |
| *F21Y 115/10* | (2016.01) | |
| *F21Y 113/13* | (2016.01) | |
| *F21Y 101/00* | (2016.01) | |
| *F21Y 105/00* | (2016.01) | |

(52) U.S. Cl.
CPC ............ *G02F 1/167* (2013.01); *G09G 3/22* (2013.01); *G09G 3/32* (2013.01); *H01L 23/4821* (2013.01); *H01L 23/5381* (2013.01); *H01L 25/0753* (2013.01); *H01L 25/167* (2013.01); *H01L 27/156* (2013.01); *H01L 33/36* (2013.01); *H01L 33/38* (2013.01); *H01L 33/48* (2013.01); *H01L 33/50* (2013.01); *H01L 33/502* (2013.01); *H01L 33/508* (2013.01); *H01L 33/58* (2013.01); *H01L 33/60* (2013.01); *H01L 33/62* (2013.01); *H05B 33/089* (2013.01); *H05K 1/0306* (2013.01); *H05K 1/09* (2013.01); *H05K 1/181* (2013.01); *H05K 1/182* (2013.01); *H05K 5/0017* (2013.01); *F21Y 2101/00* (2013.01); *F21Y 2105/00* (2013.01); *F21Y 2105/10* (2016.08); *F21Y 2113/13* (2016.08); *F21Y 2115/10* (2016.08); *G09G 2300/0452* (2013.01); *G09G 2300/0842* (2013.01); *G09G 2310/0264* (2013.01); *H01L 33/20* (2013.01); *H01L 33/405* (2013.01); *H01L 2224/18* (2013.01); *H01L 2224/73267* (2013.01); *H01L 2224/92244* (2013.01); *H05K 2201/0329* (2013.01); *H05K 2201/10106* (2013.01); *H05K 2201/10128* (2013.01); *H05K 2201/10166* (2013.01)

(56) References Cited

U.S. PATENT DOCUMENTS

| | | | |
|---|---|---|---|
| 5,550,066 A | 8/1996 | Tang et al. | |
| 5,621,555 A | 4/1997 | Park | |
| 5,625,202 A | 4/1997 | Chai | |
| 5,748,161 A | 5/1998 | Lebby et al. | |
| 5,815,303 A | 9/1998 | Berlin | |
| 5,994,722 A | 11/1999 | Averbeck et al. | |
| 6,025,730 A | 2/2000 | Akram et al. | |
| 6,084,579 A | 7/2000 | Hirano | |
| 6,087,680 A | 7/2000 | Gramann et al. | |
| 6,142,358 A | 11/2000 | Cohn et al. | |
| 6,143,672 A | 11/2000 | Ngo et al. | |
| 6,169,294 B1 | 1/2001 | Biing-Jye et al. | |
| 6,184,477 B1 | 2/2001 | Tanahashi | |
| 6,278,242 B1 | 8/2001 | Cok et al. | |
| 6,288,824 B1 | 9/2001 | Kastalsky | |
| 6,340,999 B1 | 1/2002 | Masuda et al. | |
| 6,392,340 B1 | 5/2002 | Yoneda et al. | |
| 6,403,985 B1 | 6/2002 | Fan et al. | |
| 6,410,942 B1 | 6/2002 | Thibeault et al. | |
| 6,466,281 B1 | 10/2002 | Huang et al. | |
| 6,504,180 B1 | 1/2003 | Heremans et al. | |
| 6,577,367 B2 | 6/2003 | Kim | |
| 6,650,382 B1 | 11/2003 | Sumida et al. | |
| 6,660,457 B1 | 12/2003 | Imai et al. | |
| 6,703,780 B2 | 3/2004 | Shiang et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,828,724 B2 | 12/2004 | Burroughes | |
| 6,933,532 B2 | 8/2005 | Arnold et al. | |
| 6,969,624 B2 | 11/2005 | Iwafuchi et al. | |
| 6,975,369 B1 | 12/2005 | Burkholder | |
| 7,009,220 B2 | 3/2006 | Oohata | |
| 7,012,382 B2 | 3/2006 | Cheang et al. | |
| 7,091,523 B2 | 8/2006 | Cok et al. | |
| 7,098,589 B2 | 8/2006 | Erchak et al. | |
| 7,127,810 B2 | 10/2006 | Kasuga et al. | |
| 7,129,457 B2 | 10/2006 | McElroy et al. | |
| 7,195,733 B2 | 3/2007 | Rogers et al. | |
| 7,259,391 B2 | 8/2007 | Liu et al. | |
| 7,288,753 B2 | 10/2007 | Cok | |
| 7,402,951 B2 | 7/2008 | Cok | |
| 7,417,648 B2 | 8/2008 | Credelle | |
| 7,420,221 B2 | 9/2008 | Nagai | |
| 7,466,075 B2 | 12/2008 | Cok et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,614,757 B2 | 11/2009 | Nesterenko et al. | |
| 7,622,367 B1 | 11/2009 | Nuzzo et al. | |
| 7,629,955 B2 | 12/2009 | Asao et al. | |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 * | 11/2010 | Cok .................. | B82Y 20/00 313/110 |
| 7,872,722 B2 | 1/2011 | Kimura | |
| 7,893,612 B2 | 2/2011 | Cok | |
| 7,898,734 B2 | 3/2011 | Coleman et al. | |
| 7,919,342 B2 | 4/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,948,172 B2 | 5/2011 | Cok et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 | 8/2011 | Cok et al. | |
| 7,999,454 B2 | 8/2011 | Winters et al. | |
| 8,004,758 B2 | 8/2011 | Coleman et al. | |
| 8,029,139 B2 | 10/2011 | Ellinger et al. | |
| 8,039,847 B2 | 10/2011 | Nuzzo et al. | |
| 8,058,663 B2 | 11/2011 | Fan et al. | |
| 8,198,621 B2 | 6/2012 | Rogers et al. | |
| 8,207,547 B2 | 6/2012 | Lin | |
| 8,243,027 B2 | 8/2012 | Hotelling et al. | |
| 8,261,660 B2 | 9/2012 | Menard | |
| 8,288,843 B2 | 10/2012 | Kojima et al. | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |

(56) References Cited

U.S. PATENT DOCUMENTS

| | | |
|---|---|---|
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,599,118 B2 | 12/2013 | Cok |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,829,663 B2 | 9/2014 | Pohl et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,896,505 B2 | 11/2014 | Cok et al. |
| 8,901,578 B2 | 12/2014 | Kobayakawa et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,022,632 B2 | 5/2015 | Kim et al. |
| 9,048,449 B2 | 6/2015 | Kim et al. |
| 9,105,813 B1 | 8/2015 | Chang |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,226,361 B2 | 12/2015 | Toth |
| 9,277,618 B2 | 3/2016 | Odnoblyudov et al. |
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,860,955 B2 | 1/2018 | Kim et al. |
| 9,871,345 B2 | 1/2018 | Bower et al. |
| 2001/0022564 A1 | 9/2001 | Youngquist et al. |
| 2002/0096994 A1 | 7/2002 | Iwafuchi et al. |
| 2002/0171792 A1* | 11/2002 | Kubota ............ G02F 1/133555 349/114 |
| 2004/0080483 A1 | 4/2004 | Chosa |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1* | 6/2005 | Bellmann ............ B41M 5/265 313/503 |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1 | 8/2012 | Cok |
| 2012/0206499 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |

(56) References Cited

U.S. PATENT DOCUMENTS

| | | |
|---|---|---|
| 2014/0027709 A1 | 1/2014 | Higginson et al. |
| 2014/0082934 A1 | 3/2014 | Cok |
| 2014/0084240 A1 | 3/2014 | Hu et al. |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0192079 A1 | 7/2014 | Lee et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1* | 11/2014 | Bathurst ............ F21K 9/00 362/249.02 |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0260388 A1 | 9/2016 | Yata et al. |
| 2016/0266697 A1 | 9/2016 | Cheng et al. |
| 2016/0343772 A1 | 11/2016 | Bower et al. |
| 2016/0351539 A1 | 12/2016 | Bower et al. |
| 2016/0364030 A1 | 12/2016 | Peana et al. |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0352646 A1 | 12/2017 | Bower et al. |
| 2017/0357127 A1 | 12/2017 | Cok et al. |
| 2017/0358717 A1 | 12/2017 | Cok et al. |
| 2018/0033853 A1 | 2/2018 | Bower et al. |
| 2018/0041005 A1 | 2/2018 | Bower et al. |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

International Search Report, PCT/EP2015/063709, dated Dec. 15, 2015, 6 pages.

International Search Report, PCT/EP2015/069553, dated Nov. 27, 2015, 6 pages.

Lee, S. H. etal, Laser Lift-Offof GaN Thin Film and its Application to the Flexible Light Emitting Diodes, Proc. of SPIE 8460:846011-1-846011-6 (2012).

Roscher, H., VCSEL Arrays with Redundant Pixel Designs for 10Gbits/s 2-D Space-Parallel MMF Transmission, Annual Report, optoelectronics Department, (2005).

Yaniv et al., A 640x480 Pixel Computer Display Using Pin Diodes with Device Redundancy, 1988 International Display Research Conference, IEEE, CH-2678-1/88:152-154 (1988).

U.S. Appl. No. 14/788,632, filed Jun. 30, 2015, X-Celeprint Limited.

U.S. Appl. No. 14/807,311, filed Jul. 23, 2015, X-Celeprint Limited.

U.S. Appl. No. 14/822,866, filed Aug. 10, 2015, Bower et al.

Cok, R. S. et al., AMOLED displays with transfer-printed integrated circuits, Journal of SID 19/(4):335-341 (2011).

Hamer et al., "63.2: AMOLED Displays Using Transfer-Printed Integrated Circuits," SID 09 Digest, 40(2):947-950 (2009).

Johnson, K. et al., Advances in Red VCSEL Technology, Advances in Optical Technologies, 2012:569379, 13 pages. (2012).

Kasahara, D. et al, Nichia reports first room-temperature blue/'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Seurin, J.F. et al, High-power red VCSEL arrays, Proc. of SPIE 8639:1-9 (2013).

Yoon, J. et al., Heterogeneously Integrated Optoelectronic Devices Enabled by MicroTransfer Printing, Adv. Optical Mater. 3:1313-1335 (2015).

(56) References Cited

OTHER PUBLICATIONS

Choi, H. W. et al., Efficient GaN-based Micro-LED Arrays, Mat. Res. Soc. Symp. Proc. 743:L6.28.1-L6.28.6 (2003).
Poher, V. et al., Micro-LED arrays: a tool for two-dimensional neuron stimulation, J. Phys. D: Appl. Phys. 41:094014 (2008).
U.S. Appl. No. 14/822,868, Bower et al.

* cited by examiner

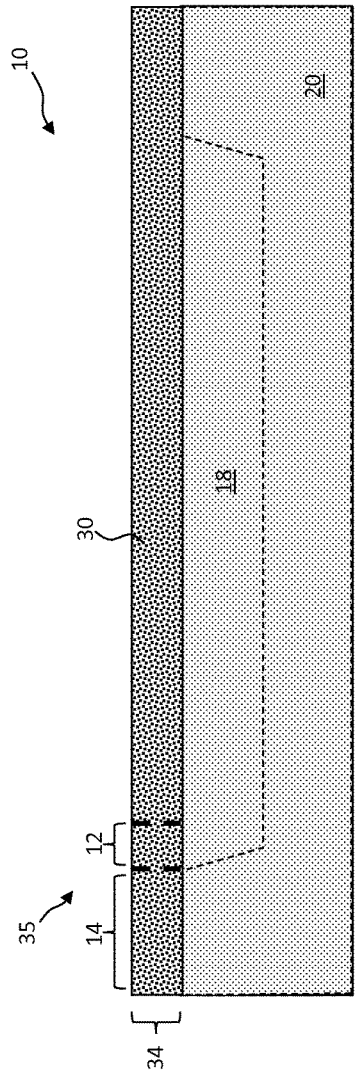
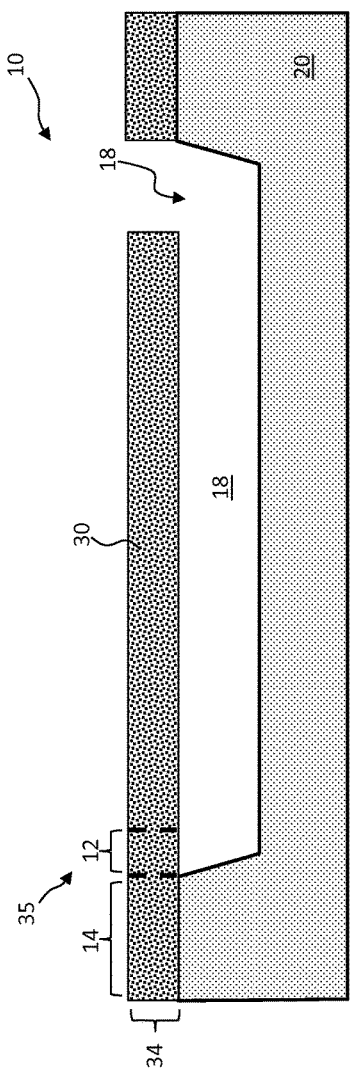

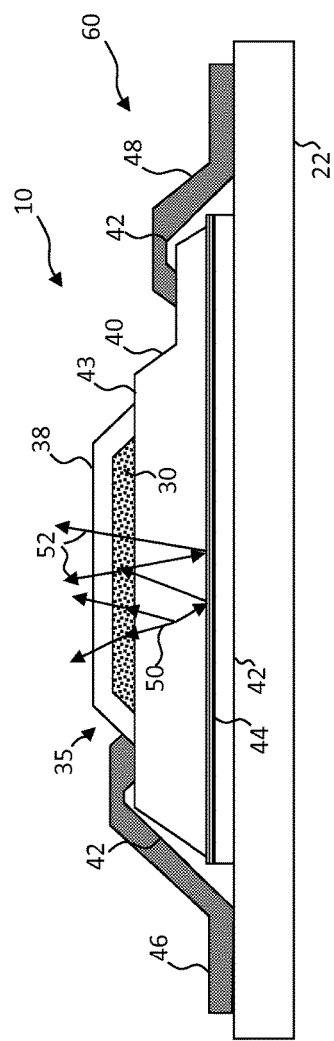
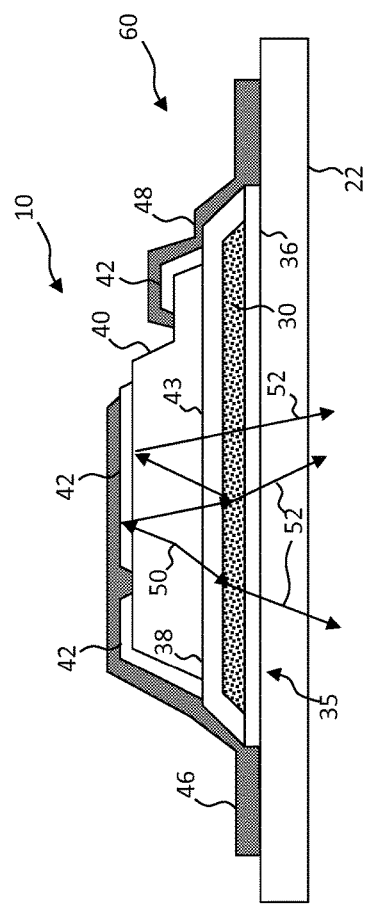

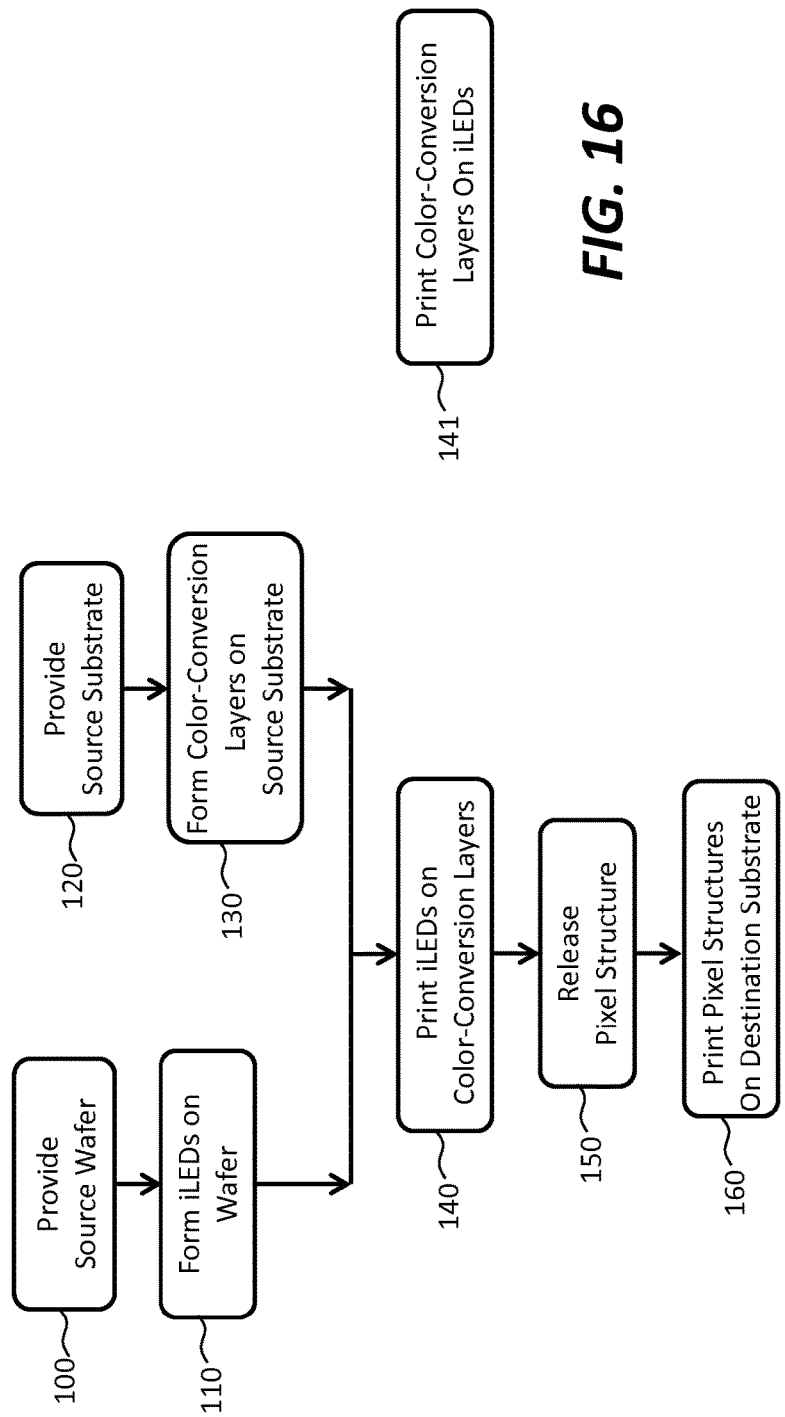

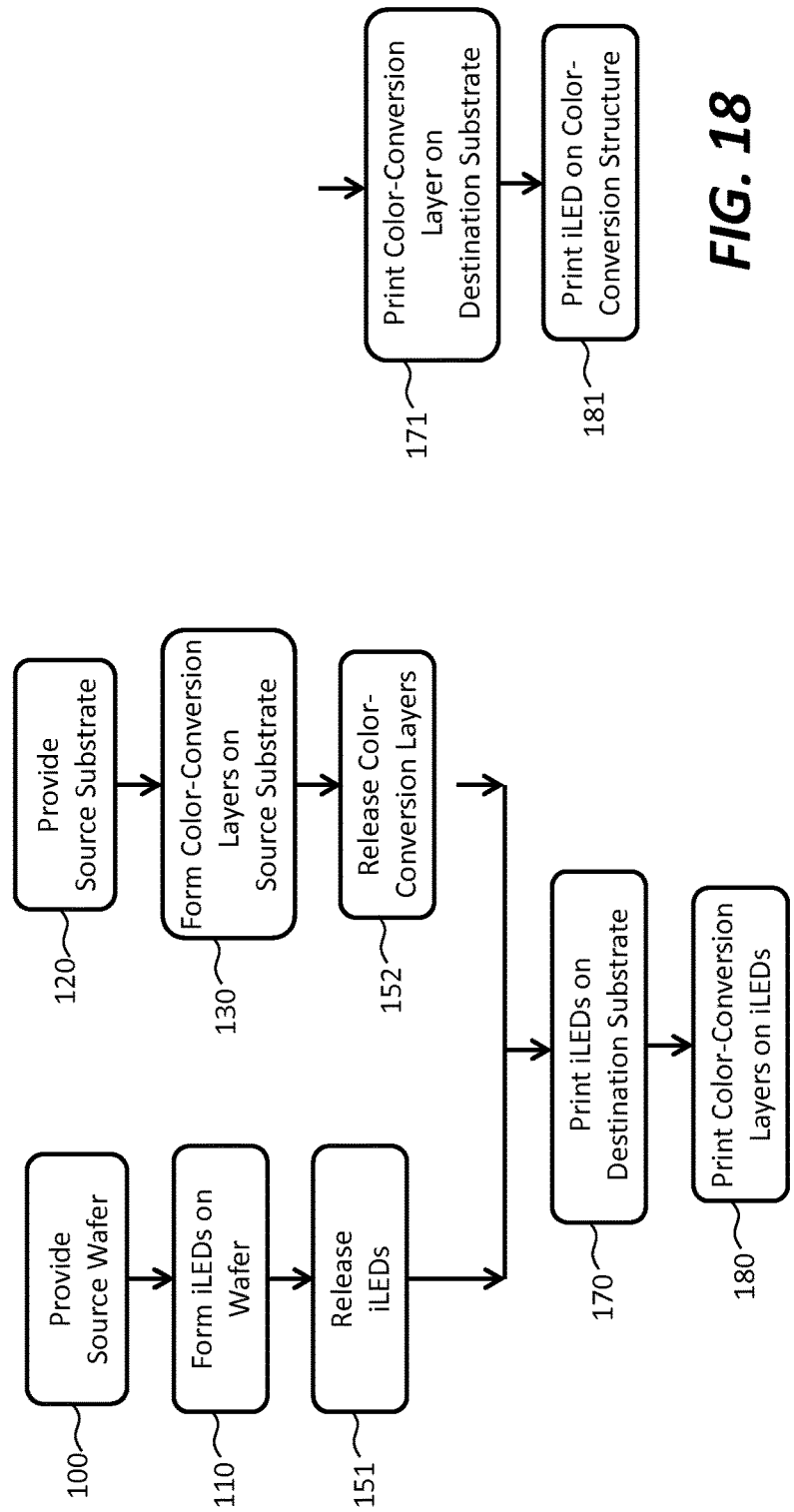

DISPLAY WITH COLOR CONVERSION

CROSS REFERENCE TO RELATED APPLICATION

This application is related to commonly assigned U.S. patent application Ser. No. 14/743,940 filed Jun. 18, 2015, entitled Micro-Assembled LED Displays and Lighting Elements, which is hereby incorporated by reference in its entirety.

FIELD OF THE INVENTION

The present invention relates to displays having color-conversion materials such as phosphors or quantum dots that are excited by light having a higher frequency and radiate light having a lower frequency and light diffusers. More particularly, light excitation is provided by a light-emitting diode or light-emitting-diode laser.

BACKGROUND OF THE INVENTION

Conventional cathode ray tube (CRT) displays rely on an electron beam that sweeps over a phosphor-coated display surface on the inside of the tube to form an image. Different phosphors are stimulated by the high-energy electrons to emit different colors of light, for example red, green, and blue corresponding to pixels in the displayed image. Phosphors are also commonly used with solid-state light-emitting diodes to emit white light. For example, a blue-light emitting diode (LED) coated with phosphors that absorb a portion of the emitted blue light and emitted yellow light appears white to the human visual system. Similarly, organic light-emitting diode (OLED) illumination devices using phosphors are described in WO 2010032603.

Flat-panel light-emitting diode (LED) displays that incorporate luminescence-converting elements (such as phosphors) are described in U.S. Pat. No. 5,994,722. Alternatively, OLED displays can employ a single high-frequency light emitter together with color-conversion materials (also known as color-change materials) to provide a variety of color light output. The color-conversion materials absorb the high-frequency light and re-emit light at lower frequencies. For example, an LED or OLED device can emit blue light suitable for a blue sub-pixel and employ a green color-conversion material layer to absorb the blue light to emit green light and employ a red color-conversion material layer to absorb the blue light to emit red light. The color-conversion materials can be combined with color filters to further improve the color of the emitted light and to absorb incident light and avoid exciting the color-conversion materials with ambient light, thereby improving device contrast. Light-scattering phosphorescent or fluorescent particles excited by organic light-emitting diodes (OLEDs) are described in U.S. Pat. No. 7,834,541. U.S. Patent Pub. No. 20050116621 A1 entitled Electroluminescent devices and methods of making electroluminescent devices including a color conversion element also describes the use of color-conversion materials.

Layers having color-conversion materials can be combined with scattering particles to enhance the performance of the color-conversion materials by increasing the likelihood that incident light will interact with the color-conversion materials, thereby reducing the concentration or thickness of the layer. Such a combination may also prevent light emitted by the color-conversion material from being trapped in the color-conversion material layer. U.S. Pat. No. 7,791,271 describes a top-emitting OLED with color conversion materials and U.S. Pat. No. 7,969,085 discloses a color change material layer. U.S. Patent Pub. No. 20050275615 A1 entitled Display device using vertical cavity laser arrays describes such a layer as does U.S. Patent Pub. No. 20040252933 entitled Light Distribution Apparatus. U.S. Patent Pub. No. 20050012076 entitled Fluorescent member, and illumination device and display device including the same teaches the use of color-conversion materials as scattering particles. U.S. Patent Pub. No. 20040212296 teaches the use of scattering particles in a color-conversion material layer to avoid trapping the frequency-converted light. Diffusers are also useful in increasing the viewing angle of display pixels. U.S. patent application Ser. No. 11/361,094, filed Feb. 24, 2006, entitled Light-Scattering Color-Conversion Material Layer describes integral light-scattering color-conversion material layers.

Flat-panel displays typically rely on thin-film semiconductor structures to provide control signals that control the pixels in the flat-panel display. However, such thin-film structures have relatively low performance when compared to crystalline semiconductor structures typically used in integrated circuits. Furthermore, LED emitters, and especially micro-LED emitters have a relatively small light-emitting area and aperture ratio when used in flat-panel displays. Color-conversion layers coated over an entire flat-panel substrate are therefore wasteful since most of the layer is not excited by light-emission from the LEDs. Patterning the substrate at the resolution needed with micro-LEDs is difficult and the use of larger LEDs that are individually coated with color-conversion material limits the resolution of the flat-panel display.

There is a need, therefore, for devices, systems and methods for providing color-conversion structures in combination with micro-LEDs in a flat-panel display that enable high resolution, effective use of color-conversion material, and excellent performance efficiency, viewing angle, and colors.

SUMMARY OF THE INVENTION

Embodiments of the present invention provide a flat-panel display with improved electrical performance, improved optical performance, simplified structures, and reduced costs. In one aspect, the present invention provides a micro-transfer printable color-conversion structure that can be micro-transfer printed to a destination or display substrate. Micro-light-emitting diodes (micro-LEDs or µLEDs) are also micro-transfer printed to the same substrate and disposed so that some light emitted from the µLEDs at a relatively higher frequency is absorbed by the color-conversion structure and re-emitted at a relatively lower frequency. Arrays of different color-conversion structures can include different color-conversion materials that emit light of different colors, for example red, green, and blue, providing pixels in a full-color display.

Micro-light-emitting diodes can be micro-transfer printed onto a micro-transfer printable color-conversion structure to form a heterogeneous pixel structure (a heterogeneous structure has different kinds of elements making up a pixel device or a portion of a pixel device that emits light to provide a display pixel). The heterogeneous pixel structure can be micro-transfer printed as a unit onto a substrate. Alternatively, the color-conversion structures are micro-transfer printed onto the micro-light-emitting diodes to form a pixel structure that can be micro-transfer printed as a single unit onto a substrate. In other embodiments, the micro-lightemitting diodes and color-conversion structures are separately micro-transfer printed onto the substrate to provide the display pixels. Diffusers and reflectors can be included to increase the efficiency of the pixel structures in the display.

By providing micro-transfer printable color-conversion structures on a source substrate at higher density and with a larger fill factor than on a display substrate, the amount of color-conversion material wasted is reduced. The percentage of the source substrate that is dedicated to color-conversion structures is much greater than for a display substrate, particularly because the light-emissive area of the micro-LEDs and the consequent aperture ratio of the display substrate is relatively small. Thus, a greater percentage of the color-conversion material is applied to the color-conversion structures in a coating on the source substrate than in a coating on the display substrate so that less color-conversion material is wasted in the source substrate coating than is wasted in the display substrate coating.

Local pixel controllers can also be included in each pixel structure to provide active-matrix control. The pixel controllers together with the micro-LEDs and the color-conversion structures can be constructed in a compound micro assembly structure, for example forming a display tile on a tile substrate. The display tiles can be surface-mountable structures that are readily manipulated, printed, or interconnected on a display substrate using established surface mount technology techniques. Alternatively, the tiles can be micro-transfer printable to a display substrate.

The micro-light-emitting diodes can be made using crystalline semiconductors in a semiconductor wafer and then micro-transfer printed to a display substrate, for example a glass substrate, thus increasing the light-output efficiency and resolution of the micro-LEDs and reducing the substrate and assembly cost. Not all colors of light are emitted with equal efficiency by micro-LEDs. Therefore, a single type of high-efficiency micro-LED that emits blue, violet, or ultraviolet light that is absorbed by the different color-conversion structures making up each pixel in a display enables differently colored saturated light output with improved efficiency. In one embodiment, the micro-LEDs are solid-state organic or inorganic micro-LED lasers.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1A and 1B are cross sections of color-conversion structure in an embodiment of the present invention;

FIGS. 8, 9, and 10 are cross sections of various pixel structures in various embodiments of the present invention;

FIGS. 15-19 are flow diagrams illustrating methods in various embodiments of the present invention.

Figure 2:
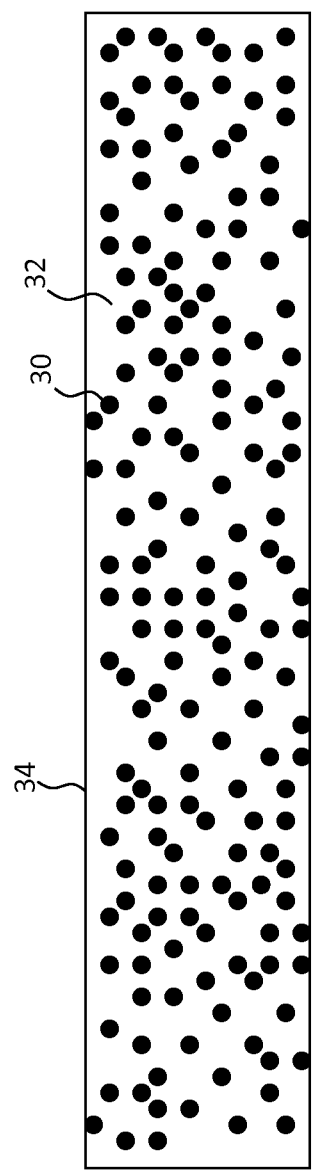
FIG. 2 is a detail cross section of FIG. 1.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to the cross sections of FIG. 1A and FIG. 1B, in an embodiment of the present invention a color-conversion structure 10 comprises an article 35 (i.e., a color-conversion article) including a color-conversion material 30 disposed within a color-conversion layer 34 that can include multiple sub-layers. In the example shown in FIGS. 1A and 1B, the color-conversion layer is unpatterned. The unpatterned color-conversion layer 34 of FIG. 1 can be disposed on the source substrate 20 by first forming a liquid mixture including the color-conversion materials 30 in a curable liquid (e.g., a resin coating) that can be applied to the source substrate by, for example, spin coating the mixture over the source substrate, and then curing the mixture to form the color-conversion layer 34. Alternatively, evaporation, sputtering, or sprinkling methods can be used.

At least a portion of a tether 12 is connected to the article 35 and extends or protrudes from the article 35, for example from a periphery, edge or side of the article 35. The color-conversion structure 10 can be attached with the tether 12 to an anchor 14 of a source substrate 20 (e.g., a native substrate on which the color-conversion structure 10 is formed). The anchor 14 can be a portion of the source substrate 20 to which a tether 12 is attached. In one configuration, the source substrate 20 has one or more sacrificial portions 18 and a corresponding color-conversion structure 10 is disposed or formed on or over each sacrificial portion 18 of the source substrate 20. The sacrificial portion 18 can be a designated area or portion of the source substrate 20 (e.g., as in FIG. 1A), a sacrificial material layer, a portion of a sacrificial material layer, a patterned sacrificial material layer, or a cavity under the color-conversion structure 10, for example formed by removing a portion or all of a sacrificial material layer. As shown in FIG. 1B, the sacrificial portion 18 is a cavity above which the color-conversion structure 10 is suspended by the tether 12 affixed to the anchor 14 so that the tether 12 extends from a periphery of the sacrificial portion 18 (at an anchor 14) to a periphery of the color-conversion structure 10. According to an embodiment of the present invention, the color-conversion structure 10 can be micro-transfer printed.

As shown in FIG. 2, in one embodiment of the present invention, the color-conversion layer 34 includes color-conversion material 30 disposed within a transparent matrix 32. For example, the transparent matrix can be a resin, a polymer, or a curable resin. The source substrate 20 can be a semiconductor source substrate 20, for example silicon, such as silicon (1 0 0) or silicon (1 1 1), glass, plastic, or other materials suitable for wafers. Sacrificial layers or sacrificial portions 18 can include layers or patterned layers of etchable materials, for example such as oxides or nitrides such as silicon oxide or silicon nitride, or portions of the source substrate 20 that are differentially etchable in different directions (for example by taking advantage of the crystalline structure of the source substrate 20 to etch in one direction more rapidly than in another direction).

As intended herein, an optical-conversion structure 10 includes color-conversion materials 30 that redirect or re-emit light emitted from a light source, such as an organic light-emitting diode (OLED) or an inorganic light-emitting diode (iLED) or LED laser. A color-conversion material 30 is any material that absorbs electromagnetic radiation of a relatively higher frequency and emits electromagnetic radiation of a relatively lower frequency. The higher frequency electromagnetic radiation can be visible light, ultra-violet radiation, or infrared radiation. The higher-frequency electromagnetic radiation can be blue or violet visible light. The lower-frequency electromagnetic radiation can also be visible, ultra-violet radiation, or infrared radiation. According to one embodiment of the present invention, the higher frequency radiation is ultra-violet, violet, or blue and the lower frequency electromagnetic radiation is visible light, such as blue, cyan, green, yellow, orange, or red light. The color-conversion material 30 can include one or more of an inorganic phosphor, an organic phosphor, a ceramic phosphor, an inorganic fluorophore, an organic fluorophore, yttrium aluminum garnet, doped yttrium aluminum garnet, cesium-doped yttrium aluminum garnet (YAG), yttrium phosphate-vanadate, and a quantum dot.

According to a further embodiment of the present invention, the source substrate has one or more sacrificial portions 18, for example forming an array of sacrificial portions 18 over, on, or in the source substrate 20. Each sacrificial portion 18 has a color-conversion layer 34 disposed on or over each of the sacrificial portions 18. In each case, a tether 12 extends from an anchor 14 (e.g., from a periphery of the sacrificial portion 18) to a periphery of the color-conversion structure 10 to connect the color-conversion structure 10 to the source substrate 20. The array of color-conversion structures 10 can be micro-transfer printed from the source substrate 20 to a destination substrate 22 (e.g., a display substrate 22) as is described further below and, for example, in U.S. patent application Ser. No. 14/743,981, filed Jun. 18, 2015, entitled Micro Assembled LED Displays and Lighting Elements, which is hereby incorporated by reference in its entirety.

Figure 3:
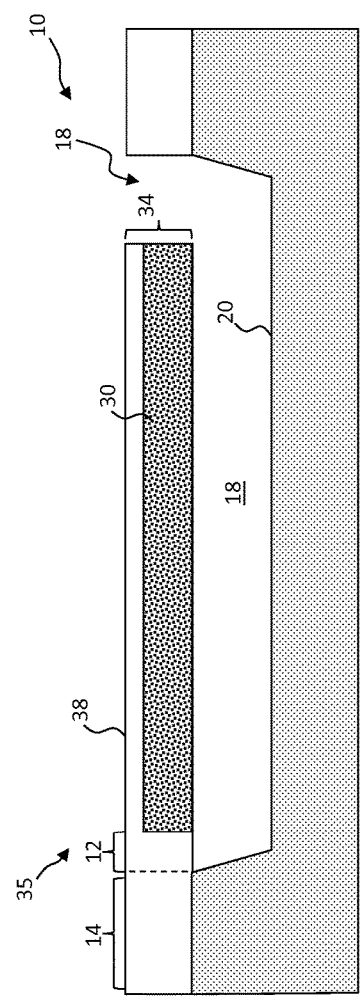
FIG. 3 is a cross section of a patterned color-conversion structure in an alternative embodiment of the present invention.

In FIG. 1, the color-conversion layer 34 is not patterned and the anchor 14 and tether 12 both include color-conversion material 30. Referring to FIG. 3, in an alternative embodiment the color-conversion material 30 or color-conversion layer 34 is patterned over the sacrificial portions 18. In the alternative embodiment of FIG. 3, neither the anchor 14 nor the tether 12 include the color-conversion material 30.

The patterned color-conversion layer 34, as shown in FIG. 3, can be formed by photolithographically processing a blanket-coated layer of color-conversion materials 30 in a photo-curable matrix, such as a photoresist, exposing the blanket-coated layer of color-conversion materials 30 to patterned electro-magnetic radiation (e.g., ultra-violet light through a patterned mask), and then developing the patternwise exposed coating. The patterned color-conversion layer 34 forms a first layer and a second layer 38 of material that does not include color-conversion material 30 can be coated over the patterned color-conversion layer 34 to form the tether 12 and anchor 14 of FIG. 3.

Figure 4:
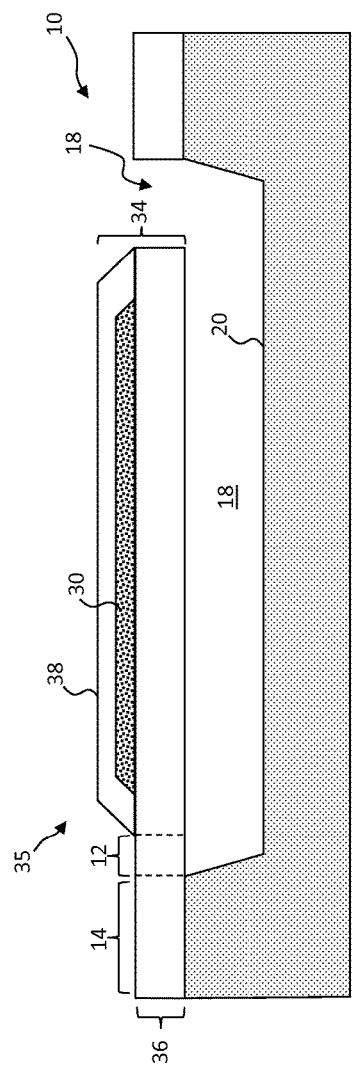
FIGS. 4 and 5 are cross sections of alternative encapsulated color-conversion structures in other embodiments of the present invention.

Referring to FIG. 4, in another embodiment, the color-conversion layer 34 further includes a first layer 36 on which the color-conversion material 30 is disposed and a second layer 38 that is disposed on the color-conversion material 30 so that the first layer 36 and second layers 38 encapsulate the color-conversion materials 30. The first layer 36, the color-conversion material 30, and the second layer 38 form the color-conversion layer 34. In this embodiment, the color-conversion materials 30 can be provided in a transparent matrix 32 (not shown, as in FIGS. 1-3) or in a layer deposited on the first layer 36. The layer can be very thin, for example a few nanometers or less, or relatively thick, for example 10-100 microns or more and can be deposited by evaporation, by spray coating, by sputtering, or by sprinkling. The embodiment of FIG. 4 is useful for color-conversion structures 10 in which the transparent matrix 32, for example curable liquids, can damage or otherwise inhibit the performance of the color-conversion materials 30.

Figure 5:
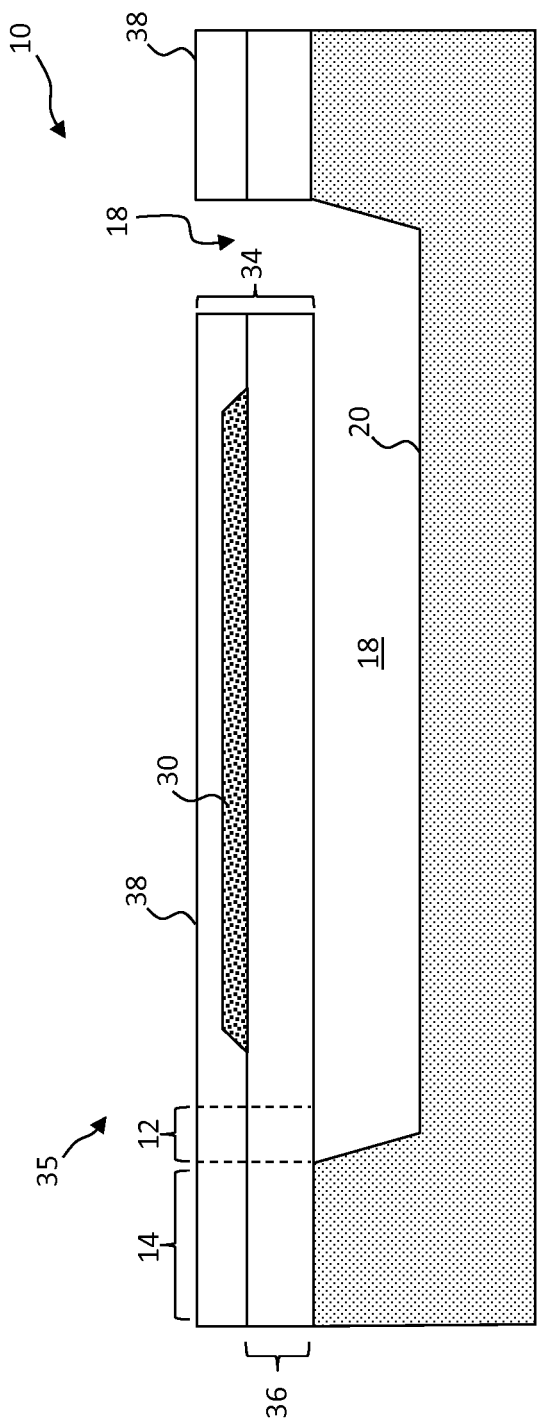

As illustrated in FIG. 5, the first layer 36 is coated over the entire source substrate and is therefore a portion of the tether 12 and anchor 14. As shown in FIG. 5 and as in FIG. 3, the second layer 38 can also be coated over the entire source substrate 20 so that the second layer 38 also makes up a portion of the tether 12 or anchor 14.

In an embodiment of the present invention, the first layer 36 is transparent, the second layer 38 is transparent, or both the first layer 36 and the second layer 38 are transparent. In another embodiment, the first layer 36 is reflective and the second layer 38 is transparent. In yet another embodiment, the second layer 38 is reflective and the first layer 36 is transparent. Transparent materials can include photoresist materials, such as SU8 or other resins, epoxies, polymers, or glasses that can be coated in a liquid state and cured or laminated over and adhered to layers. Reflective layers can include metals such as silver or aluminum that can be evaporated or laminated onto a surface.

Figure 6:
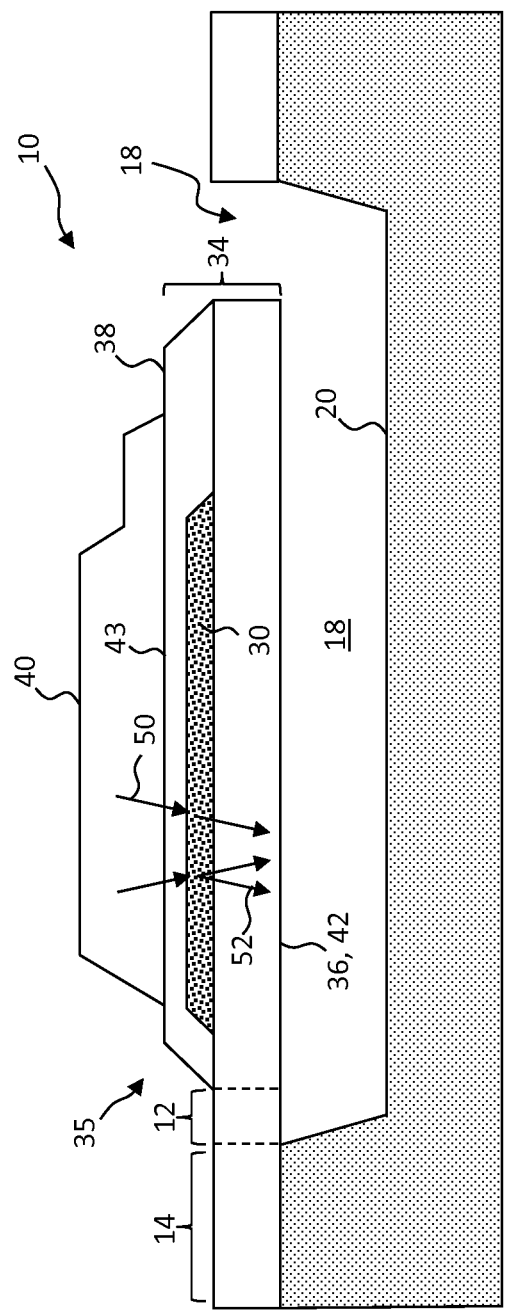
FIGS. 6 and 7 are cross sections of alternative arrangements of a color-conversion structure and an inorganic light-emitting diode in alternative embodiments of the present invention.

Referring to FIG. 6, a color-conversion structure 10 of the present invention can include an organic or inorganic micro-light-emitting diode (micro-LED) 40 having a light-emitting side 43 disposed to emit light 50 toward the color-conversion material 30 in the article 35. In one embodiment, the micro-LED 40 is a solid-state LED laser. Micro-LED 40 devices having various structures can be made using, for example, doped or undoped semiconductor materials and can be made using photolithographic techniques. An inorganic LED (iLED) or organic LED (OLED can be a micro-LED 40. The term micro-LED 40 is used herein to generically refer to OLED or iLED devices that can also be LED lasers. The micro-LEDs 40 can be relatively small, for example in embodiments each micro-LED 40 has a width from 2 to 5 µm, 5 to 10 µm, 10 to 20 µm, or 20 to 50 µm, each micro-LED 40 has a length from 2 to 5 µm, 5 to 10 µm, 10 to 20 µm, or 20 to 50 µm, or each micro-LED 40 has a height from 2 to 5 µm, 4 to 10 µm, 10 to 20 µm, or to 50 µm. Similarly, in embodiments when placed on a display substrate 22, the display substrate 22 has a contiguous display substrate area that includes the micro-LEDs 40, each micro-LED 40 has a light-emissive area, and the combined light-emissive areas of the micro-LEDs 40 is less than or equal to one-quarter of the contiguous display substrate area or wherein the combined light-emissive areas of the micro-LEDs 40 is less than or equal to one eighth, one tenth, one twentieth, one fiftieth, one hundredth, one five-hundredth, one thousandth, one two-thousandth, or one ten-thousandth of the contiguous display substrate area. Furthermore, each micro-LED 40 has an anode and a cathode disposed on a same side of the respective micro-LED 40 and, optionally, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

According to an embodiment of the present invention, the micro-LED 40 can emit higher-frequency light 50 that is absorbed by the color-conversion materials 30 in the color-conversion layer 34. The color-conversion materials 30 then emit color-converted light 52 of a lower frequency than the higher-frequency absorbed light 50. As illustrated in the embodiment of FIG. 6, the article 35 including the color-conversion material 30 is located between the micro-LED 40 and the sacrificial portion 18 on the source substrate 20. In the embodiment of FIG. 6, the micro-LED 40 can be constructed on the article 35 using photolithographic processes. In an alternative method, a previously constructed micro-LED 40 formed on another source substrate different from the source substrate 20 can be micro-transfer printed onto the color-conversion layer 34 to form the color-conversion structure 10 of FIG. 6. The micro-LED 40 can be constructed or printed on the article 35 before the sacrificial layer 18 is removed or a cavity formed beneath the article 35.

Figure 7:
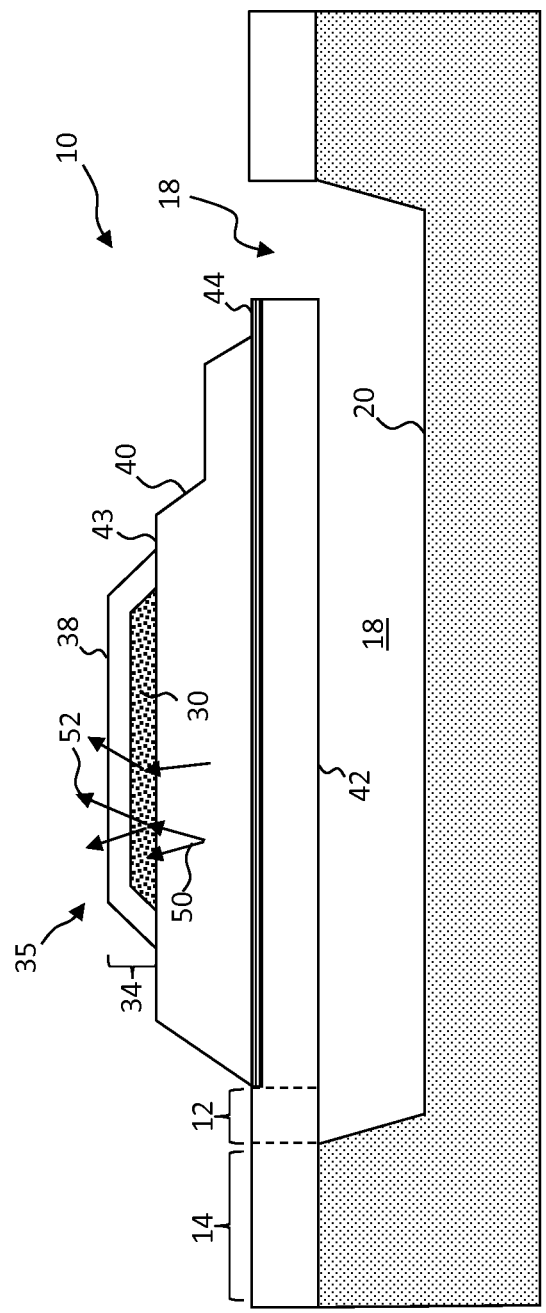

In a different embodiment shown in FIG. 7, the micro-LED 40 is located between the color-conversion material 30 and the sacrificial portion 18. In the structure of FIG. 7, the second layer 38 is transparent and the micro-LED 40 serves as the first layer 36 found in FIGS. 4 and 5. In the embodiment of FIG. 7, the color-conversion layer 34 can be constructed on the micro-LED 40 using photolithographic processes. In an alternative method, a previously constructed color-conversion layer 34 formed on a source substrate different from the source substrate 20 can be micro-transfer printed onto the micro-LED to form the color-conversion structure 10 of FIG. 7. The color-conversion layer 34 can be constructed or printed on the micro-LED 40 before the sacrificial layer 18 is removed or a cavity formed beneath the micro-LED 40.

Referring to FIG. 8 and according to various embodiments, the color-conversion structure 10 of FIG. 7 can be disposed on a destination substrate 22, for example by micro-transfer printing, and at least a portion of a tether 12 is a broken or fractured tether 12 (not shown). As shown in FIG. 8, the color-conversion structure 10 (including the article 35 and the micro-LED 40) is disposed on the destination substrate 22 to form a pixel structure 60. The micro-LED 40 has a light-emitting side 43 disposed to emit light 50 to the color-conversion material 30. In the embodiment of FIG. 8, the micro-LED 40 is located between the article 35 and the destination substrate 22. The destination substrate 22 can be opaque or reflective. An array of such pixel structures 60 can be used to form a display and the destination substrate 22 can be a display substrate 22 (e.g., common to each pixel structure 60). The embodiment of FIGS. 7 and 8 illustrates a top-emitting structure that emits light 50 from the pixel structure 60 in a direction opposite the destination substrate 22 on which the pixel structure 60 is disposed. In alternative arrangements, either of the pixel structures 60 of FIGS. 8 and 9 is disposed upside-down on the destination substrate 22 to emit light in the opposite direction as that indicated in FIGS. 8 and 9. Such arrangements can be made using intermediate transfer stamps with micro-transfer printing and arrange the micro-LEDs 40 on a side of the color-conversion layer 34 opposite the destination substrate 22 (in contrast to FIG. 8) or arrange the article on a side of the micro-LEDs 40 opposite the destination substrate 22 (in contrast to FIG. 9).

In addition to the micro-LED 40 on which the article 35 is located, an optional reflective structure 44 such as a reflective layer is disposed between the micro-LED 40 and the destination substrate 22. Alternatively, the destination substrate 22 can be reflective. If present, the reflective structure 44 serves to reflect light 50 emitted from the micro-LED 40 toward the destination substrate 22 to the color-conversion layer 34. The reflective structure 44 can be a metal layer, for example a metal such as silver or aluminum, or other metals or reflective materials evaporated or laminated onto either the destination substrate 22 or the micro-LED 40. Alternating layers of materials having different refractive indices can also be used to form a reflector for light having desired wavelengths. The reflective structure 44 can be electrically conductive or electrically insulating. If the reflective structure 44 is electrically conductive, the reflective structure 44 can spread current provided to the micro-LED 40. If the reflective structure 44 is not present and if the destination substrate 22 is transparent to the light 50 emitted from the micro-LED 40, light 50 emitted from the micro-LED 40 can pass through the destination substrate 22.

The micro-LED 40 is provided with electrical current through first and second electrodes 46, 48. The first and second electrodes 46, 48 are electrically connected to the micro-LED 40 at desired locations, as shown, and electrically insulated from the edges of the micro-LED 40 by dielectric layers 42 (for example oxides such as silicon dioxide). By electrically connecting the first and second electrodes 46, 48 at desired locations, the location of hole and electron recombination in the micro-LED 40 is controlled to optimize light emission from the micro-LED 40.

The pixel structure 60 of FIG. 8 is operated by providing an electrical current between the first and second electrodes 46, 48. Current flows within the micro-LED 40, causing the micro-LED 40 to emit light 50 at a pre-determined frequency. Some of the light 50 is emitted toward the color-conversion material 30; other light 50 is emitted toward the reflective structure 44 (if present) and is reflected back toward the color-conversion material 30. The color-conversion material 30 absorbs at least some of the micro-LED-emitted light 50 and emits color-converted light 52 having a frequency lower than the micro-LED-emitted light 50. Some of the color-converted light 52 emitted from the color-conversion material 30 is emitted in a direction toward the top of the pixel structure 60 and away from the destination substrate 22, for example toward an observer (not shown). Other color-converted light 52 emitted from the color-conversion material 30 is emitted toward the destination substrate 22 and is reflected from the reflective structure 44 (if present) back toward the top of the pixel structure 60 and away from the destination substrate 22. If the reflective structure 44 is not present and if the destination substrate 22 is transparent, the color-converted light 52 can pass through the destination substrate 22. An electrode disposed on the bottom of the micro-LED between the micro-LED and the destination substrate 22 can be a non-reflective, transparent electrical conductor such as a transparent conductive oxide like indium tin oxide or aluminum zinc oxide enabling light to be emitted through the side of the micro-LED 40 adjacent to the destination substrate 22.

Referring to FIG. 9, and according to alternative embodiments, the color-conversion structure 10 of FIG. 6 can be disposed on a transparent destination substrate 22, for example by micro-transfer printing, and at least a portion of a tether 12 is a broken or fractured tether 12 (not shown). As shown in FIG. 9, the color-conversion structure 10 is disposed on the destination substrate 22 to form the pixel structure 60. The micro-LED has a light-emitting side 43 disposed to emit light 50 to the color-conversion material 30. In the embodiment of FIG. 9, the color-conversion material 30 is located between the micro-LED 40 and the destination substrate 22. The destination substrate 22 can be transparent. An array of such pixel structures 60 can be used to form a display and the destination substrate 22 can be a display substrate 22. The embodiment of FIGS. 6 and 9 illustrates a bottom-emitting structure that emits light from the pixel structure 60 through the destination substrate 22 on which the pixel structure 60 is disposed. The first and second electrodes 46, 48 that provide electrical current to the micro-LED 40 can also serve as reflectors that reflect emitted light 50 to the color-conversion layer 34. The first and second electrodes 46, 48 can be a metal, for example a metal such as silver or aluminum, or other metals or reflective materials evaporated or laminated onto the destination substrate 22 or the micro-LED 40. Alternating layers of materials having different refractive indices can also be used to form a reflector for light having desired wavelengths independently of the first and second electrodes 46, 48 if the first and second electrodes 46, 48 do not adequately cover the micro-LED 40.

The micro-LED 40 is provided with electrical current through first and second electrodes 46, 48. The first and second electrodes 46, 48 are electrically connected to the micro-LED 40 at desired locations, as shown, and electrically insulated from the edges of the micro-LED 40 by dielectric layers 42 (for example oxides such as silicon dioxide). By electrically connecting the first and second electrodes 46, 48 at desired locations, the location of hole and electron recombination in the micro-LED 40 is controlled to optimize light emission.

The pixel structure 60 of FIG. 9 is operated by providing an electrical current between the first and second electrodes 46, 48. Current flows within the micro-LED 40, causing the micro-LED 40 to emit light 50 at a pre-determined frequency. Some of the light 50 is emitted toward the color-conversion material 30; other light 50 is emitted toward the reflective first or second electrodes 46, 48 (or other reflective structures) and is reflected back toward the color-conversion material 30. The color-conversion material absorbs at least some of the micro-LED-emitted light 50 and emits color-converted light 52 having a frequency lower than the micro-LED-emitted light 50. Some of the color-converted light 52 emitted from the color-conversion material 30 is emitted in a direction toward the bottom of the pixel structure 60 and through the destination substrate 22, for example toward an observer (not shown). Other color-converted light 52 emitted from the color-conversion material 30 is emitted toward and reflected from the reflective first or second electrodes 46, 48 (or other reflective structures) back toward the bottom of the pixel structure 60 and through the destination substrate 22. If the reflective structures 44 are not present on the top of the micro-LED 40 (i.e., the side of the micro-LED 40 opposite the destination substrate 22), the color-converted light 52 can pass through the top of the micro-LED 40. For example, a non-reflective, transparent electrical conductor such as a transparent conductive oxide like indium tin oxide or aluminum zinc oxide can provide the first or second electrodes 46, 48 enabling light to be emitted from the top of the micro-LED 40.

Figure 10:
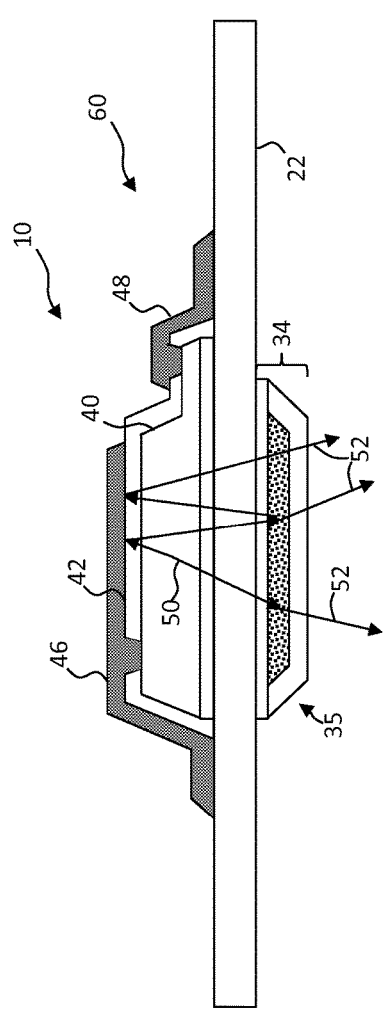

Referring to the embodiment of FIG. 10, a transparent substrate 22 (e.g., the destination or display substrate 22), is located between the micro-LED 40 and the color-conversion material 30. In this configuration, the micro-LED 40 functions as a bottom emitter and the color-conversion layer 34 functions as a top emitter. This structure enables the micro-LED 40 and the color-conversion layer 34 to be independently disposed on opposite sides of the transparent substrate 22, facilitating manufacturing processes.

As in the configuration of FIG. 9, in the embodiment of FIG. 10 the micro-LED 40 is provided with electrical current through first and second electrodes 46, 48. The first and second electrodes 46, 48 are electrically connected to the micro-LED 40 at desired locations and electrically insulated from the edges of the micro-LED 40 by dielectric layers 42 (for example oxides such as silicon dioxide). By electrically connecting the first and second electrodes 46, 48 at desired locations, the location of hole and electron recombination in the micro-LED 40 is controlled to optimize light emission.

The pixel structure 60 of FIG. 10 is operated by providing an electrical current between the first and second electrodes 46, 48. Current flows within the micro-LED 40, causing the micro-LED 40 to emit light 50 at a pre-determined frequency. Some of the light 50 is emitted through the transparent substrate 22 toward the color-conversion material 30; other light 50 is emitted toward the reflective first or second electrodes 46, 48 (or other reflective structures) and is reflected back through the transparent substrate 22 toward the color-conversion material 30. The color-conversion material 30 absorbs at least some of the micro-LED-emitted light 50 and emits color-converted light 52 having a frequency lower than the micro-LED-emitted light 50. Some of the color-converted light 52 is emitted from the color-conversion material 30 is toward an observer. Other color-converted light 52 emitted from the color-conversion material 30 is emitted through the transparent substrate 22 toward and reflected from the reflective first or second electrodes 46, 48 (or other reflective structures) back through the destination substrate 22. If the reflective structures 44 are not present on the top of the micro-LED 40 (i.e., the side of the micro-LED 40 opposite the transparent substrate 22), the color-converted light 52 can pass through the top of the micro-LED 40. For example, a non-reflective, transparent electrical conductor such as a transparent conductive oxide like indium tin oxide or aluminum zinc oxide can provide the first or second electrodes 46, 48 and enable the emission of color-converted light 52 (and light 50 emitted by the micro-LED 40) through the top of the micro-LED 40.

In the top-emitting configuration of FIGS. 7 and 8, the bottom-emitting configuration of FIGS. 6 and 9, and the alternative arrangement of FIG. 10, the thickness of the color-conversion layer 34 and the density of the color-conversion materials 30 in the article 35 can be chosen so that both the micro-LED-emitted light 50 and the color-converted light 52 are emitted from the color-conversion structure 10. Alternatively, the thickness of the color-conversion layer 34 and the density of the color-conversion materials 30 in the article 35 can be chosen so that substantially only the color-converted light 52 is emitted from the color-conversion structure 10, for example 80%, 90%, 95%, or 98%. Since the micro-LED 40 and the color-conversion layer 34 are likely to have optical (refractive) indices greater than the optical index of air, the color-conversion structure 10 can include light extraction structures to increase the amount of light emitted from the color-conversion structure 10.

A plurality of pixel structures 60 of the present invention can be provided in an array over a display substrate 22 to form a display. For example, an array of color-conversion structures 10 including micro-LEDs 40 can be disposed on the display substrate 22 and the micro-LEDs 40 interconnected using electrically conductive wires, such as metal wires, formed on the display substrate 22 to provide electrical current to the micro-LEDs 40 to emit light 50 that is color converted by the color-conversion materials 30.

Figure 11:
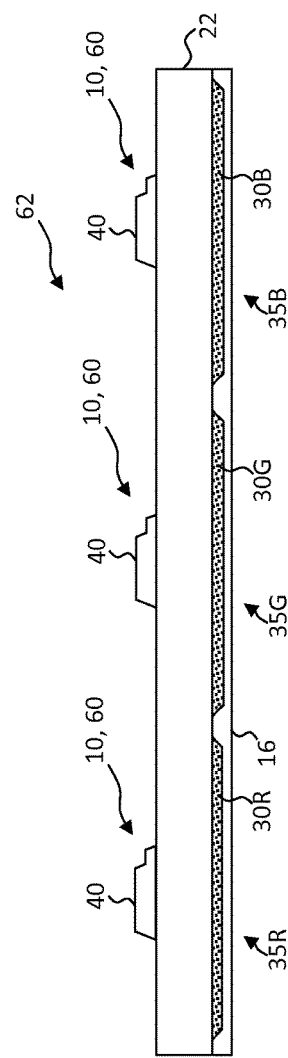
FIG. 11 is a cross section of a color display in an embodiment of the present invention.

Referring to FIG. 11, a plurality of micro-LEDs 40 are disposed in an array on the transparent display substrate 22 with red, green, and blue light-emitting color-conversion articles 35R, 35G, 35B in the configuration of FIG. 10. Different color-conversion materials 30R, 30G, 30B are provided in different corresponding color-conversion articles 35R, 35G, 35B that emit different colors of light 52, for example red color-conversion article 35R emits red light 52, green color-conversion article 35G emits green light 52, and blue color-conversion article 35B emits blue light 52. Each of the three color-conversion structures 10 forms a pixel structure 60 that provides a pixel in a display 62.

In one embodiment of the present invention, all of the micro-LEDs 40 emit light 50 having a frequency greater than the red, green, and blue light 52 emitted by the corresponding red, green, and blue color-conversion articles 35R, 35G, 35B including the red, green, and blue color-conversion materials 30R, 30G, 30B. In this embodiment, the micro-LEDs 40 pump each of the red, green, and blue color-conversion articles 35R, 35G, 35B with the same frequency of micro-LED-emitted optical pump light, regardless of the color of light 52 emitted by the red, green, and blue color-conversion articles 35R, 35G, 35B. In an alternative embodiment, a blue color-conversion article 35B is not used and is replaced by a micro-LED 40 that emits blue light 50. The blue-light-emitting micro-LEDs 40 can also be used to pump the red and green color conversion articles 35R, 35G. In this configuration, the micro-LEDs 40 all emit light 50 having a frequency greater than the green light 52.

In a further embodiment of the present invention, an array of pixel structures 60 is complemented by an array of organic light-emitting diodes (OLEDs). This arrangement is useful if at least one of the colors of light in a pixel is more efficiently or inexpensively provided by an organic rather than an inorganic LED. For example, a red OLED can be provided together with a green- and a blue-light-emitting pixel structure 60 to form a full-color pixel in the display 62.

The embodiments of FIGS. 6-9 illustrate pixel structures 60 including micro-LEDs and color-conversion layers 34 that can be micro-transfer printed in a single step from a source substrate 20 onto a destination substrate 22. The embodiment of FIG. 10 enables micro-transfer printing the micro-LEDs 40 and color-conversion layers 34 independently. In these cases, the areas of the color-conversion layer 34 and the micro-LEDs 40 over the destination substrate 22 are similar, for example within a relative factor of two, four, or ten. Thus, in an embodiment of the present invention the micro-LED 40 has a light-emitting area, the color-conversion layer 34 or material 30 is patterned into light-emitting portions, and the area of the light-emitting portions is less than or equal to ten times the micro-LED light-emitting area, is less than or equal to four times the micro-LED light-emitting area, or is less than or equal to twice the micro-LED light-emitting area.

Referring again to FIG. 11, in an alternative structure and method, the color-conversion layers 34 have an area over the destination substrate 22 that is much larger than the area of the micro-LEDs 40 over the destination substrate 22, for example greater than a relative factor of two, four, or ten. Instead of micro-transfer printing the color-conversion articles 35, the color-conversion layer 34 can be screen printed, evaporated through a shadow mask, deposited by inkjet, or otherwise deposited. Such an approach can be easier or less expensive than micro-transfer printing color-conversion articles 35 and can have larger features with a lower resolution. Thus, in another embodiment of the present invention the micro-LED 40 has a light-emitting area, the color-conversion layer 34 or material 30 is patterned into light-emitting portions, and the area of the light-emitting portions is greater than or equal to twice the micro-LED light-emitting area, is greater than or equal to four times the micro-LED light-emitting area, or is greater than or equal to ten times the micro-LED light-emitting area.

As shown in FIG. 11, the color-conversion materials 30 and color-conversion layer 34 are encapsulated with an encapsulation layer 16 to protect the red, green, and blue color-conversion materials 30R, 30G, 30B from environmental degradation. For example, organic color-conversion materials 30 can be susceptible to moisture.

Light emission from the various color-conversion structures 10 of the present invention can be enhanced with the use of diffusers that diffuse incident light, for example specular light propagating in a single direction, into diffuse light that propagates in a variety of directions. Because semiconductor materials found in micro-LEDs 40, color-conversion materials 30, or transparent matrix 32 materials can have optical refractive indices greater than the optical index of air and because the micro-LEDs 40 and color-conversion materials 30 are typically isotropic light emitters, emitted light can be trapped in the color-conversion structures 10 of the present invention due to total internal reflection. Light diffusers can modify the trajectory of trapped light and redirect it at an angle at which the light can escape.

Figure 12:
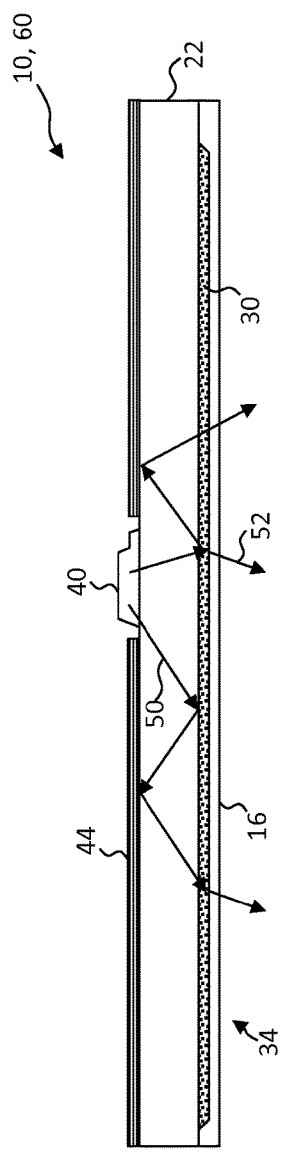
FIGS. 12 and 13 are cross sections of various pixel structures including a reflector in various embodiments of the present invention.

According to an embodiment of the present invention and as illustrated in FIG. 12, a reflective structure 44 is located on a common side of the transparent substrate 22 with the micro-LED 40. The reflecting structure can be a reflector, a reflective structure 44, a diffusive reflector 55 (FIG. 13), or a diffusive reflective structure 44. Diffuse reflectors can include metals with reflective particles or a metal-coated layer of particles having a size chosen to diffuse the wavelengths of light that are emitted by the micro-LEDs 40 and the color-conversion materials 30. The diffuser can be disposed to diffuse light emitted by the micro-LEDs 40 before the light emitted by the micro-LEDs 40 is absorbed by the color-conversion material 30 in the color-conversion layer 34. As shown in FIG. 12, light 50 emitted by the micro-LED 40 can propagate in the transparent substrate 22 and then be redirected into the color-conversion article 35 and emitted from the color-conversion structure 10. Light 52 emitted from the color-conversion article 35 that is trapped in the transparent substrate 22 can also be redirected and emitted from the color-conversion structure 10.

Figure 13:
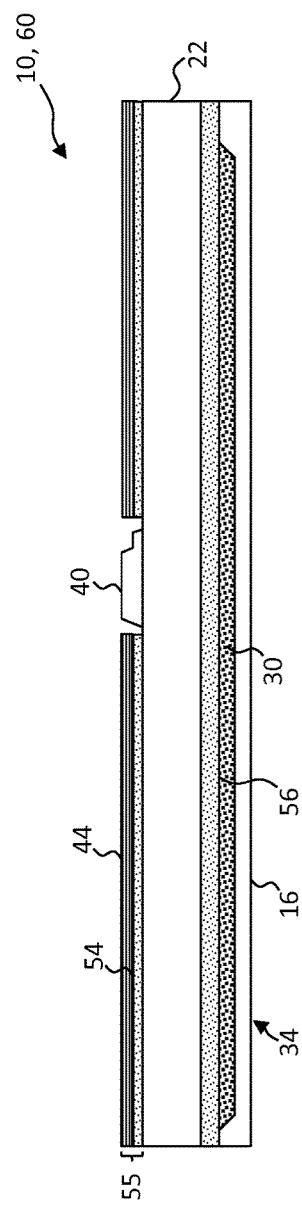
Figure 14:
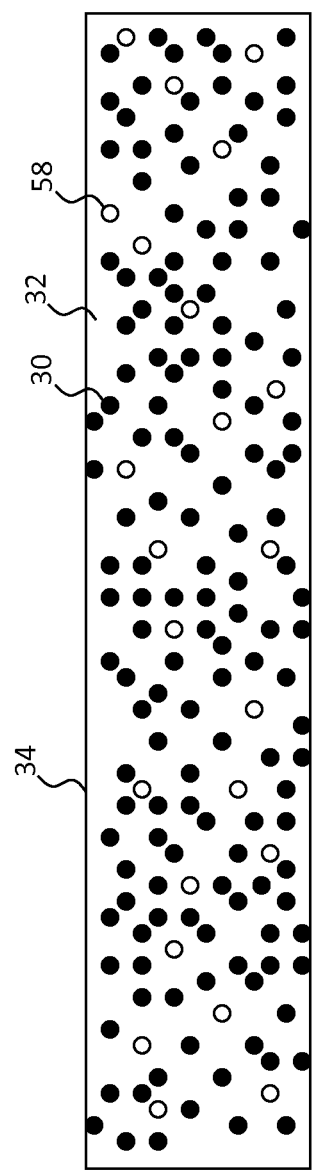
FIG. 14 is a cross section of a color-conversion structure having light diffusers according to various embodiments of the present invention.

As shown in FIG. 12, the reflective structure 44 can be a diffusive reflective layer. Alternatively, as shown in FIG. 13, a light-diffusive layer 56 can be disposed between the color-conversion layer 34 and the micro-LEDs 40 or located on a common side of the transparent substrate 22 with the micro-LEDs 40, or both, as illustrated. For example, a light diffuser 54 can be incorporated into a reflective structure 44 to form a diffusive reflector 55. As in FIG. 12, light 50 emitted by the micro-LED 40 or light 52 emitted by the color-conversion layer 34 can propagate in the transparent substrate 22 and then be redirected into the color-conversion layer 34 and emitted from the color-conversion structure 10 by the light-diffusive layers 56. Light-diffusive layers 56 can be transparent and include transparent particles having a refractive index different from a layer matrix, the transparent substrate 22, or the color-conversion layer 34. Light is diffused by refraction or reflection from the transparent particles. Alternatively, light-reflective particles can be included in the light-diffusive layers 56 to reflect and redirect light trapped in the transparent substrate 22. In another embodiment of the present invention, referring to FIG. 14, light-diffusive particles 58, either transparent or reflective can be incorporated into the color-conversion layer 34. The light-diffusive particles 58 can reflect or refract light 50 emitted by the micro-LEDs 40, the light 52 emitted by the color-conversion materials 30, or trapped light in the color-conversion layer 34.

As noted above, with respect to FIG. 11, a plurality of micro-LEDs 40 can be disposed in an array on the transparent display substrate 22 with red, green, and blue light-emitting color-conversion articles 35R, 35G, 35B. Each of the three color-conversion structures 10 forms a pixel structure 60 that provides a pixel in a display 62. Thus, a display 62 according to embodiments of the present invention can include a display substrate 22 and an array of color-conversion structures 10 disposed on the display substrate 22. Each color-conversion structure 10 includes an inorganic light-emitting diode (micro-LED) 40 disposed to emit light 50 to color-conversion material 30 or an article 35 including color-conversion material 30 on the display substrate 22. The array of color-conversion structures 10 can include an array of red color-conversion material 30R that emits red light 52 and an array of green color-conversion material 30G that emits green light 52 (collectively color-conversion material 30). The array of color-conversion structures 10 can also include an array of blue color-conversion material 30B that emits blue light 52. In an embodiment, the micro-LEDs 40 emit light 50 having a frequency higher than the frequency of light 52 emitted by the color-conversion material 30. The micro-LEDs 40 can all emit the same frequency of light 50 and can be solid-state micro-LED lasers. The color conversion structures 10 can include light-scattering or light-diffusive elements. In one embodiment of the display 62, the display substrate 22 is between the micro-LEDs 40 and the color-conversion structures 10. In another embodiment, the color-conversion structures 10 are between the micro-LEDs 40 and the display substrate 22.

In all of the display embodiments of the present invention, the micro-LEDs 40 or (micro-LED lasers) of a pixel group can be located in a row, as shown in the Figures, or in a two-dimensional arrangement, for example forming a triangle on the display substrate 22 surface (not shown).

In an embodiment of the present invention, the display 62 or micro-LED laser display 64 is a backlight unit (BLU). Control of the individual micro-LEDs 40 can enable local dimming, for example in a liquid crystal display.

Referring to FIG. 15, in a method of the present invention, a source wafer is provided in step 100 and one or more micro-LEDs 40 are formed on the source wafer in step 110 in a micro-transfer printable configuration, for example with an underlying release portion or sacrificial portion 18. The source wafer can be a semiconductor wafer. In step 120, a source substrate 20 distinct from the source wafer, for example made of glass, is provided and one or more corresponding color-conversion layers 34 are formed on the source substrate 20 in step 130, for example with an underlying release portion or sacrificial portion 18. The micro-LEDs 40 are released, for example by etching the sacrificial portions 18 before micro-transfer printing the micro-LEDs 40. In step 140, the micro-transfer printable micro-LEDs 40 are micro-transfer printed onto the corresponding color-conversion layers 34 to form a pixel structure 60. Additional adhesive layers, for example curable resins can be provided and cured to adhere the micro-LEDs 40 to the color-conversion layers 34 (not shown). The sacrificial portions 18 beneath the color-conversion layers 34 are then etched or otherwise removed in step 150 to release the color-conversion layer 34 and form the pixel structures 60 of FIG. 6. In step 160, the pixel structures 60 are micro-transfer printed to a destination substrate 22. An array of the pixel structures 60 can be micro-transfer printed to the destination substrate 22 to form the display 62.

In an alternative embodiment of the present invention referring to FIG. 16, the color-conversion layers 34 are released and micro-transfer printed onto the corresponding micro-LEDs 40 in step 141 in place of step 140 to form the pixel structures 60 as illustrated in FIG. 7 (with the addition of the first layer 36 as shown in FIGS. 4 and 5). In either of the embodiments of FIGS. 15 and 16, the color conversion layers 34 of FIGS. 1 and 3 can be used in place of the color-conversion layers 34 illustrated in FIG. 4.

Referring to FIG. 17, in another method of the present invention, a source wafer is provided in step 100 and one or more micro-LEDs 40 are formed on the source wafer in step 110 in a micro-transfer printable configuration, for example with an underlying release or sacrificial portion 18. The source wafer can be a semiconductor wafer. In step 120 a source substrate 20 distinct from the source wafer, for example made of glass, is provided and one or more corresponding color-conversion layers 34 are formed on the source substrate 20 in step 130, for example with an underlying release or sacrificial portion 18. The sacrificial portions 18 of the source wafer are removed to release the micro-LEDs 40 from the source wafer in step 151. The sacrificial portions 18 of the source substrate 20 are removed to release the color-conversion layers 34 from the source substrates 20 in step 152. In step 170, the micro-transfer printable micro-LEDs 40 are micro-transfer printed onto the destination substrate 22. In step 180, the color-conversion layers 34 are correspondingly micro-transfer printed onto the micro-LEDs 40 to form the pixel structures 60 of FIG. 8. Additional adhesive layers, for example curable resins, can be provided and cured to adhere the micro-LEDs 40 to the color-conversion layers 34 (not shown). An array of the micro-LEDs 40 and corresponding color-conversion layers 34 can be micro-transfer printed to the destination substrate 22 to form the display 62.

In an alternative embodiment of the present invention and referring to FIG. 18, the color-conversion layers 34 are micro-transfer printed onto the destination substrate 22 in step 171 in place of step 170. The micro-LEDs 40 are then micro-transfer printed onto the corresponding color-conversion layer 34 in step 181 in place of step 180 to form the pixel structures 60 of FIG. 9. In either of the embodiments of FIGS. 23 and 24, the color conversion layer 34 of FIGS. 1 and 3 can be used in place of the color-conversion layer 34 illustrated in FIGS. 8 and 9.

Figure 19:
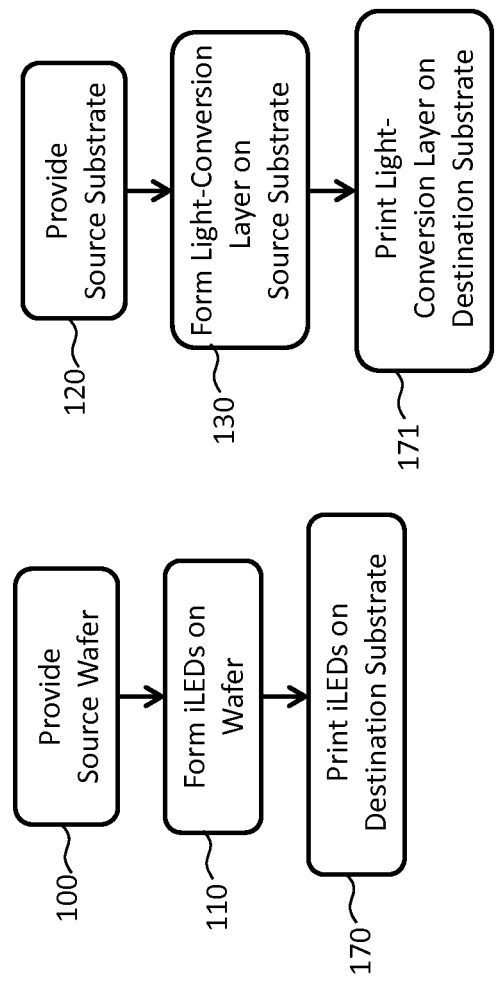

In yet another embodiment of the present invention referring to FIG. 19, a source wafer is provided in step 100 and one or more micro-LEDs 40 are formed on the source wafer in step 110 in a micro-transfer printable configuration, for example with an underlying release or sacrificial portion 18. The source wafer can be a semiconductor wafer. The micro-LEDs 40 are printed on the destination substrate 22 in step 170. In step 120 a source substrate 20 distinct from the source wafer, for example made of glass, is provided and one or more corresponding color-conversion layers 34 are formed on the source substrate 20 in step 130, for example with an underlying release or sacrificial portion 18. The color-conversion layers 34 are printed on the destination substrate 22 in step 171, for example on a side of the display substrate 22 opposite the side of the display substrate 22 on which the micro-LEDs 40 are disposed. The color-conversion layers 34 are printed in spatial correspondence with the micro-LEDs 40 so the light 50 emitted from the micro-LEDs 40 propagates into the color-conversion layers 34, as shown in FIG. 10. Steps 170 and 171 can be performed independently, at different times, or in different places. In various embodiments, the color-conversion layers 34 are micro-transfer printed or, especially with reference to FIG. 11, screen printed or otherwise photolithographically formed.

In all of these embodiments, the reflective structures 44 or light-diffusive layers 54 or 56, or encapsulation layer 16 can be formed and patterned as necessary using photolithographic or lamination processes.

In various methods of the present invention, the pixel structures 60, micro-LEDs 40, or color-conversion layers 34 are micro-transfer printed to a display substrate 22. For a discussion of micro-transfer printing techniques see, U.S. Pat. Nos. 8,722,458, 7,622,367 and 8,506,867, each of which is hereby incorporated by reference.

In another method of the present invention, the pixel structures 60 are disposed on the display substrate 22 by micro-transfer printing using compound micro assembly structures and methods, for example as described in U.S. patent application Ser. No. 14/822,868, filed Aug. 10, 2015, entitled Compound Micro-Assembly Strategies and Devices, which is hereby incorporated by reference in its entirety. The micro-LED 40 structures on the display substrate 22 can be interconnected using photolithographic methods or using printed circuit board methods and materials, for example to a display controller (not shown).

In useful embodiments, the display substrate 22 includes material, for example glass or plastic, different from a material in an integrated-circuit or chiplet substrate, for example a semiconductor material such as silicon. The display substrate 22 usefully has two opposing smooth sides suitable for material deposition, photolithographic processing, or micro-transfer printing of color-conversion structures 10. The display substrate 22 can have the size of a conventional display, for example a rectangle with a diagonal of a few centimeters to one or more meters. Such substrates are commercially available. The display substrate 22 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present invention, the color-conversion structures 10 emit light 52 through the display substrate 22. In other embodiments, the color-conversion structures 10 emit light 52 in a direction opposite the display substrate 22. The display substrate 22 can have a thickness from 5 to microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to embodiments of the present invention, the display substrate 22 can include layers formed on an underlying structure or substrate, for example a rigid or flexible glass or plastic substrate.

According to various embodiments, the micro-transfer-printed displays 62, 64 of the present invention include a variety of designs having a variety of resolutions, color-conversion structure 10 sizes, and displays having a range of display areas. For example, display areas ranging from 1 cm by 1 cm to 10 m by 10 m in size are contemplated. The resolution of color-conversion structures 10 over a display area can also vary, for example from tens of color-conversion structures 10 per inch to hundreds of color-conversion structures 10 per inch. Thus, the present invention has application in both low-resolution and very high-resolution displays and from very small to very large displays.

In an embodiment, the micro-LEDs 40 are formed in substrates or on supports separate from the display substrate 22. For example, the color-conversion structures 10, micro-LEDs 40 are separately formed in a semiconductor source wafer. The color-conversion structures 10 micro-LEDs 40 are then removed from the source wafer and transferred, for example using micro-transfer printing, to the display substrate 22 or to a compound micro-assembly substrate (not shown).

By employing a multi-step transfer or assembly process, intermediate testing is enabled, increased yields are achieved, and costs are reduced for the micro-transfer-printed displays 62, 64 of the present invention. Additional details useful in understanding and performing aspects of the present invention are described in U.S. patent application Ser. No. 14/743,981, filed Jun. 18, 2015, entitled Micro Assembled LED Displays and Lighting Elements, which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a sacrificial layer or sacrificial portion 18 is considered "on" a substrate when a layer of sacrificial material or sacrificial portion 18 is on top of the substrate, when a portion of the substrate itself is the sacrificial layer, or when the sacrificial layer or sacrificial portion 18 comprises material on top of the substrate and a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 color-conversion structure
12 tether
14 anchor
16 encapsulation layer
18 sacrificial portion
20 substrate/source substrate/source wafer
22 destination substrate/display substrate/transparent substrate
30 color-conversion material
30R red color-conversion material that emits red light
30G green color-conversion material that emits green light
30B blue color-conversion material that emits blue light
32 transparent matrix
34 color-conversion layer
35 article
35R red color-conversion article
35G green color-conversion article
35B blue color-conversion article
36 first layer
38 second layer
40 micro light-emitting diode (micro-LED)
42 dielectric layer
43 micro-LED light-emitting side
44 reflective structure/layer
45 light absorbers
46 first electrode
48 second electrode
50 light emitted from micro-LED
52 light emitted from color-conversion material
53 diffuse light
54 light diffuser
55 diffusive reflector
56 light-diffusive layer/light diffuser
57 refractive lens
58 light-diffusive particle
60 pixel structure
62 display
64 micro-LED laser display
100 provide source wafer step
110 form micro-LED on wafer step
120 provide source substrate step
130 form color-conversion layer on wafer step
140 micro-transfer print micro-LED on color-conversion layer step
141 micro-transfer print color-conversion layer on micro-LED step
150 release pixel structure step
151 release micro-LEDs step
152 release color-conversion layers step
160 micro-transfer print pixel structure on destination substrate step
170 micro-transfer print micro-LED on destination substrate step
171 micro-transfer print color-conversion layer on destination substrate step
180 micro-transfer print color-conversion layer on micro-LED step
181 micro-transfer print micro-LED on color-conversion layer step

What is claimed is:

1. A color-conversion structure, comprising:
   an article comprising a color-conversion material disposed within a color-conversion layer, wherein the color-conversion material re-emits or redirects light by absorbing electromagnetic radiation of a relatively higher frequency and emitting electromagnetic radiation of a relatively lower frequency;
   at least a portion of a tether connected to the article, wherein the at least a portion of a tether extends from the article.

2. The structure of claim 1, wherein the article comprises:
   a first layer;
   the color-conversion material disposed on and in contact with the first layer; and
   a second layer disposed on and in contact with the color-conversion material, the first and second layers encapsulating the color-conversion material.

3. The structure of claim 1, comprising a micro-light-emitting diode (micro-LED) having a light-emitting side disposed to emit light toward the color-conversion material.

4. The structure of claim 3, wherein the micro-LED is a solid-state laser.

5. The structure of claim 1, comprising:
   a source substrate having one or more sacrificial portions;
   the color-conversion layer disposed on or over each of the sacrificial portions; and
   the tether extending from a periphery of the sacrificial portion.

6. The structure of claim 5, comprising a micro-light-emitting diode (micro-LED) having a light-emitting side disposed to emit light toward the color-conversion material and wherein the color-conversion material is located between the micro-LED and the sacrificial layer.

7. The structure of claim 5, comprising a micro-light-emitting diode (micro-LED) having a light-emitting side disposed to emit light toward the color-conversion material and wherein the micro-LED is located between the color-conversion material and the sacrificial layer.

8. The structure of claim 1, comprising a micro-light-emitting diode (micro-LED) having a light-emitting side disposed to emit light toward the color-conversion material and, optionally wherein the micro-LED is a micro-transfer printable or micro-transfer printed micro-LED, forming a pixel structure.

9. The structure of claim 8, comprising a transparent destination substrate and wherein the pixel structure is disposed on the transparent destination substrate.

10. The structure of claim 8, comprising a destination substrate and wherein the pixel structure is disposed on the destination substrate and the color-conversion material is located between the micro-LED and the destination substrate or the pixel structure is disposed on the destination substrate and the destination substrate is located between the micro-LED and the color-conversion material.

11. The structure of claim 8, comprising a destination substrate and wherein the pixel structure is disposed on the destination substrate and the micro-LED is located between the color-conversion material and the destination substrate.

12. A color-conversion structure, comprising:
    a source substrate having one or more sacrificial portions; and
    one or more pixel or sub-pixel structures, each pixel or sub-pixel structure comprising:
    an article comprising a color-conversion material that re-emits or redirects light by absorbing electromagnetic radiation of a relatively higher frequency and emitting electromagnetic radiation of a relatively lower frequency disposed within a color-conversion layer on or over each of the sacrificial portions,
    a micro-light-emitting diode (micro-LED) having a light-emitting side disposed to emit light toward the color-conversion material, the article disposed on the micro-LED on a side of the micro-LED opposite the sacrificial portion, and one or more tethers, each tether extending from the micro-LED.

13. The structure of claim 12, wherein the micro-LED is an organic or inorganic solid-state laser or an organic or inorganic semiconductor laser.

14. A display, comprising:

a display substrate;

an array of color-conversion structures disposed on the display substrate, each color-conversion structure comprising a micro-light-emitting diode (micro-LED) disposed to emit light toward an article comprising a color-conversion material on the display substrate, wherein the color-conversion material re-emits or redirects light by absorbing electromagnetic radiation of a relatively higher frequency and emitting electromagnetic radiation of a relatively lower frequency; and at least a portion of a tether extending from the article.

15. The display of claim 14, wherein the micro-LEDs are lasers.

16. The display of claim 14, wherein each micro-LED has an anode and a cathode disposed on a same side of the respective micro-LED and, optionally, the anode and cathode of a respective light emitter are horizontally separated by a horizontal distance, wherein the horizontal distance is from 100 nm to 500 nm, 500 nm to 1 micron, 1 micron to 20 microns, 20 microns to 50 microns, or 50 microns to 100 microns.

17. A display, comprising:

a display substrate;

an array of color-conversion structures disposed on the display substrate, each color-conversion structure including a micro-light-emitting diode (micro-LED) disposed to emit light toward an article comprising a color-conversion material on the display substrate, wherein the display substrate is between the article and the micro-LED and the color-conversion material re-emits or redirects light by absorbing electromagnetic radiation of a relatively higher frequency and emitting electromagnetic radiation of a relatively lower frequency.

18. The display of claim 17, wherein the micro-LEDs are lasers.

19. A method of making a display, comprising:

providing a source wafer and a source substrate;

forming a plurality of micro-LEDs on the source wafer and a corresponding plurality of color-conversion structures on the source substrate, wherein the color-conversion structures each comprise a color-conversion material that re-emits or redirect lights by absorbing electromagnetic radiation of a relatively higher frequency and emitting electromagnetic radiation of a relatively lower frequency;

micro-transfer printing the micro-LEDs onto the color-conversion structures to form a plurality of respective pixel structures or micro-transfer printing the color-conversion structures onto the micro-LEDs to form a plurality of respective pixel structures; and micro-transfer printing the plurality of pixel structures onto a destination substrate to form the display.

20. A method of making a display, comprising:

providing a source wafer and a source substrate;

forming a plurality of micro-LEDs on the source wafer and a corresponding plurality of color-conversion structures on the source substrate, wherein the color-conversion structures each comprise a color-conversion material that re-emits or redirect lights by absorbing electromagnetic radiation of a relatively higher frequency and emitting electromagnetic radiation of a relatively lower frequency; and micro-transfer printing the micro-LEDs onto a destination substrate and micro-transfer printing the color-conversion structures onto respective micro-LEDs or micro-transfer printing the color-conversion structure onto a destination substrate and micro-transfer printing micro-LEDs onto respective color-conversion structures to form a plurality of respective pixel structures forming the display.

21. A method of making a display, comprising:

providing a source wafer and a source substrate;

forming a plurality of micro-LEDs on the source wafer and a corresponding plurality of color-conversion structures on the source substrate, wherein the color-conversion structures each comprise a color-conversion material that re-emits or redirect lights by absorbing electromagnetic radiation of a relatively higher frequency and emitting electromagnetic radiation of a relatively lower frequency; and micro-transfer printing the micro-LEDs onto a first side of a destination substrate and micro-transfer printing color-conversion structures onto a second side of the destination substrate opposite the first side and in correspondence with the micro-LED to form an array of pixels in the display.

* * * * *